United States Patent
Khaderbad et al.

(10) Patent No.: US 10,014,382 B2
(45) Date of Patent: Jul. 3, 2018

(54) SEMICONDUCTOR DEVICE WITH SIDEWALL PASSIVATION AND METHOD OF MAKING

(71) Applicant: Taiwan Semiconductor Manufacturing Company Limited, Hsin-Chu (TW)

(72) Inventors: Mrunal A. Khaderbad, Hsinchu (TW); Hsueh Wen Tsau, Zhunan Township (TW); Chia-Ching Lee, Inew Taipei (TW); Da-Yuan Lee, Jhubei (TW); Hsiao-Kuan Wei, Longtan Township (TW); Chih-Chang Hung, Hsinchu (TW); Huicheng Chang, Tainan (TW); Weng Chang, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 42 days.

(21) Appl. No.: 14/208,211

(22) Filed: Mar. 13, 2014

(65) Prior Publication Data

US 2015/0262827 A1    Sep. 17, 2015

(51) Int. Cl.
  *H01L 29/423*    (2006.01)
  *H01L 29/51*    (2006.01)
  (Continued)

(52) U.S. Cl.
  CPC ...... *H01L 29/42372* (2013.01); *H01L 29/513* (2013.01); *H01L 21/28088* (2013.01);
  (Continued)

(58) Field of Classification Search
  CPC ... H01L 29/78; H01L 29/513; H01L 29/4236; H01L 29/4966; H01L 29/66477;
  (Continued)

(56) References Cited

U.S. PATENT DOCUMENTS 6,486,478 B1    11/2002  Libby
6,764,940 B1 *   7/2004  Rozbicki .......... H01L 21/76805
                                                438/627
(Continued)

FOREIGN PATENT DOCUMENTS

JP    63-211769    9/1988
JP    H03773676 A   4/1991
(Continued)

OTHER PUBLICATIONS

Corresponding Taiwan application No. 103126709, Taiwan Office action dated May 11, 2016.

*Primary Examiner* — Cheung Lee
*Assistant Examiner* — Stephen C Smith
(74) *Attorney, Agent, or Firm* — Cooper Legal Group, LLC

(57) ABSTRACT

One or more semiconductor devices are provided. The semiconductor device comprises a gate body, a conductive prelayer over the gate body, at least one inhibitor film over the conductive prelayer and a conductive layer over the at least one inhibitor film, where the conductive layer is tapered so as to have a top portion width that is greater than the bottom portion width. One or more methods of forming a semiconductor device are also provided, where an etching process is performed to form a tapered opening such that the tapered conductive layer is formed in the tapered opening.

20 Claims, 8 Drawing Sheets

(51) Int. Cl.
    *H01L 21/768*     (2006.01)
    *H01L 21/3213*    (2006.01)
    *H01L 21/28*      (2006.01)
    *H01L 29/66*      (2006.01)
    *H01L 29/78*      (2006.01)
    *H01L 29/49*      (2006.01)

(52) U.S. Cl.
    CPC .. *H01L 21/28185* (2013.01); *H01L 21/32136* (2013.01); *H01L 21/32137* (2013.01); *H01L 21/76847* (2013.01); *H01L 21/76877* (2013.01); *H01L 29/4966* (2013.01); *H01L 29/66477* (2013.01); *H01L 29/78* (2013.01)

(58) Field of Classification Search
    CPC ......... H01L 21/28088; H01L 21/28185; H01L 21/28273; H01L 21/28506; H01L 21/32135; H01L 21/76877
    See application file for complete search history.

(56) References Cited

U.S. PATENT DOCUMENTS

| | | | |
|---|---|---|---|
| 2009/0181504 A1* | 7/2009 | Lin | H01L 21/823842 438/199 |
| 2009/0186458 A1* | 7/2009 | Yu | H01L 21/823842 438/233 |
| 2010/0130002 A1* | 5/2010 | Dao | H01L 21/76847 438/628 |
| 2010/0193701 A1 | 8/2010 | Tabat | |
| 2011/0104880 A1* | 5/2011 | Heinrich | H01L 21/28088 438/585 |
| 2011/0195570 A1* | 8/2011 | Lin | C23C 14/022 438/652 |
| 2011/0241130 A1* | 10/2011 | Chan | H01L 21/28079 257/410 |
| 2013/0026578 A1* | 1/2013 | Tsau | H01L 21/823842 257/368 |
| 2013/0056836 A1* | 3/2013 | Yu | H01L 21/823807 257/410 |
| 2013/0134494 A1* | 5/2013 | Hong | H01L 23/53238 257/316 |
| 2015/0041905 A1* | 2/2015 | Xie | H01L 29/6656 257/369 |

FOREIGN PATENT DOCUMENTS

| | | |
|---|---|---|
| JP | H07235552 A | 9/1995 |
| JP | 2011114267 A | 6/2011 |
| JP | 2013089673 A | 5/2013 |

* cited by examiner

SEMICONDUCTOR DEVICE WITH SIDEWALL PASSIVATION AND METHOD OF MAKING

BACKGROUND

Complementary metal-oxide-semiconductor (CMOS) technology is a semiconductor technology used for the manufacture of integrated circuits (ICs). CMOS transistors typically utilize a polysilicon or a metal as the gate electrode for both NMOS and PMOS transistors, wherein the gate electrode is doped with an N-type dopant to form NMOS transistors and is doped with a P-type dopant to form PMOS transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
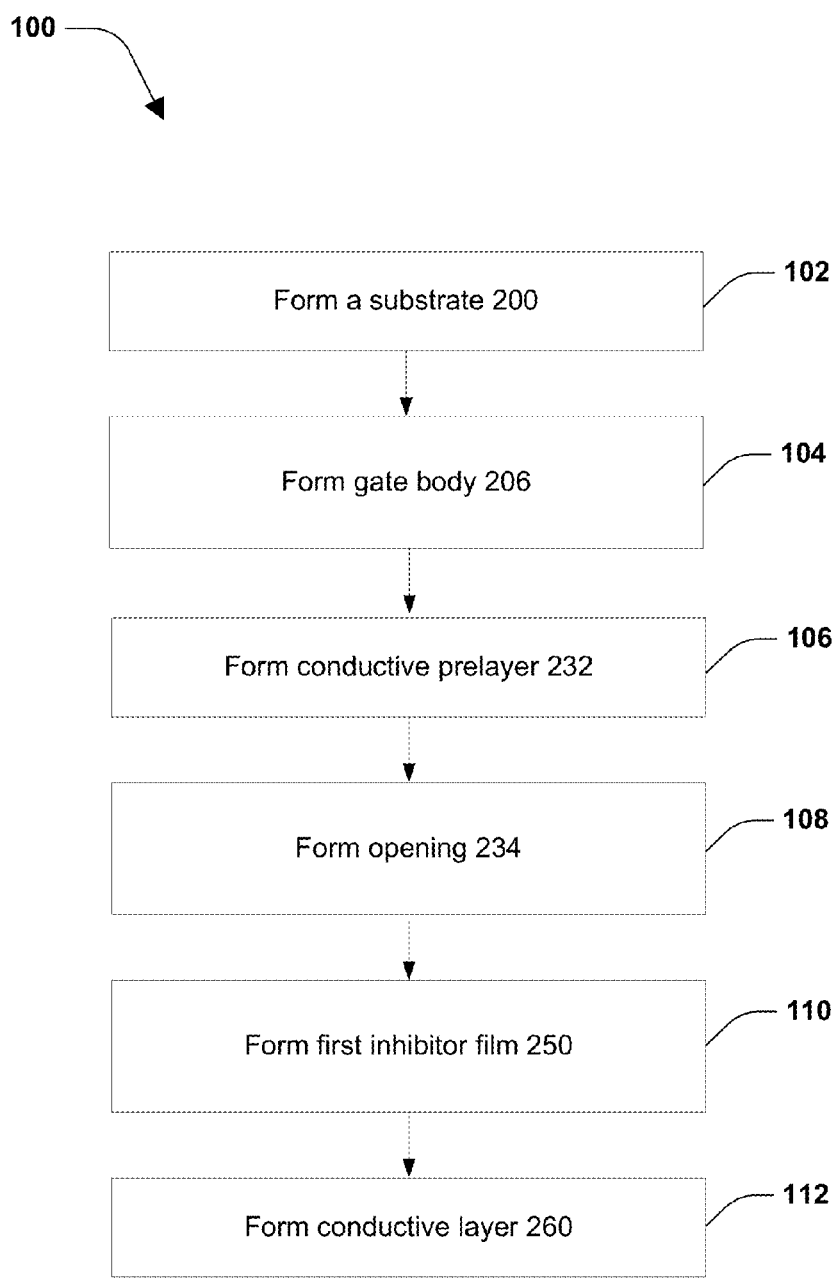
FIG. 1 is a flow diagram illustrating a method for fabricating a semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor devices and one or more methods for forming such semiconductor devices are provided herein. In some embodiments, a semiconductor device includes at least one of a multi-gate transistor, fin-type multi-gate transistor, a gate-all-around (GAA) metal-oxide-semiconductor field-effect transistor (MOSFET) or a planar metal gate CMOS. In some embodiments, the semiconductor devices include at least one of a gate body, a conductive prelayer, an inhibitor film or a conductive layer. In some embodiments, a method including a directional etching process and a sidewall passivation process are provided. In some embodiments, the method inhibits the formation of voids or seams in at least one of the conductive prelayer or the conductive layer.

Referring to FIG. 1, illustrated is a flow diagram of a method 100 for fabricating a semiconductor device 200 according to some embodiments. Referring also to FIGS. 2 to 8, illustrated are cross-sectional views of the semiconductor device 200 at various stages of fabrication according to some embodiments, such as according to the method 100 of FIG. 1. In some embodiments, part of the semiconductor device 200 is fabricated with a CMOS process flow. In some embodiments, additional processes are provided before, during, and after the method 100 of FIG. 1.

Figure 2:
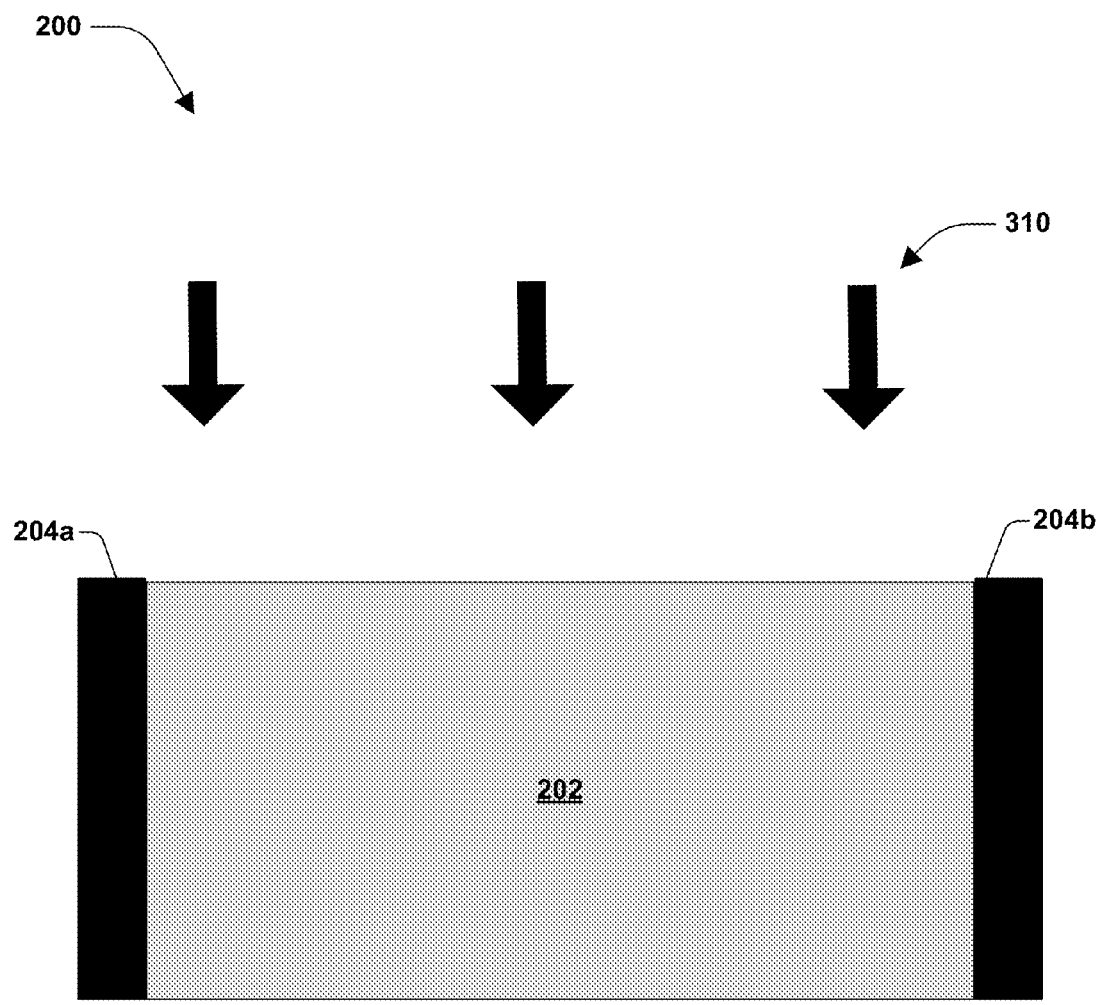
FIG. 2 is a cross-sectional view of a semiconductor device during fabrication, according to some embodiments.

At 102, a semiconductor substrate 202 is formed, as illustrated in FIG. 2. In some embodiments, the substrate 202 is merely provided or received and is not formed as part of method 100. In some embodiments, the substrate 202 includes at least one of an epitaxial layer, a silicon-on-insulator (SOI) structure, a wafer, or a die formed from a wafer. In some embodiments, the semiconductor substrate 202 is a silicon substrate. In some embodiments, the substrate 202 includes at least one of silicon germanium, silicon carbide, gallium arsenic, gallium phosphide, indium phosphide, indium arsenide, indium antimonide or other suitable semiconductor material. In some embodiments, the substrate 202 includes other features such as a buried layer or an epitaxy layer. In some embodiments, the semiconductor substrate 202 includes a doped epi layer. In some embodiments, the semiconductor substrate 202 includes a semiconductor layer overlying another semiconductor layer of a different type. In some embodiments, the semiconductor substrate 202 is a silicon layer on a silicon germanium layer.

In some embodiments, at least some of the substrate 202 is formed or treated by a first process 310. In some embodiments, the first process 310 includes at least one of an epitaxy process, an implant process or a bonding process. In some embodiments, the substrate 202 is grown by at least one of solid-phase epitaxy (SPE) or vapor-phase epitaxy. In some embodiments, the first process 310 includes implanting a dopant. In some embodiments, the dopant is at least one of n-type or a p-type dopant. In some embodiments, the n-type dopant includes at least one of arsenic or phosphorous. In some embodiments, the p-type dopant includes boron. In some embodiments, the first process 310 includes a thermal process for dopant drive-in diffusion.

In some embodiments, the semiconductor device 200 is electrically isolated from other devices by isolation structures 204a-204b. In some embodiments, at least one of the isolation structures 204a-204b is disposed in the substrate 202. In some embodiments, at least one of the isolation structures 204a-204b is a shallow trench isolation (STI)

structure. In some embodiments, the isolation structures 204a-204b include a local oxidation of silicon (LOCOS) configuration. In some embodiments, at least one of the isolation structures 206a-206b includes at least one of silicon oxide, silicon nitride, silicon oxynitride, fluoride-doped silicate glass (FSG) or a low-k dielectric material.

Figure 3:
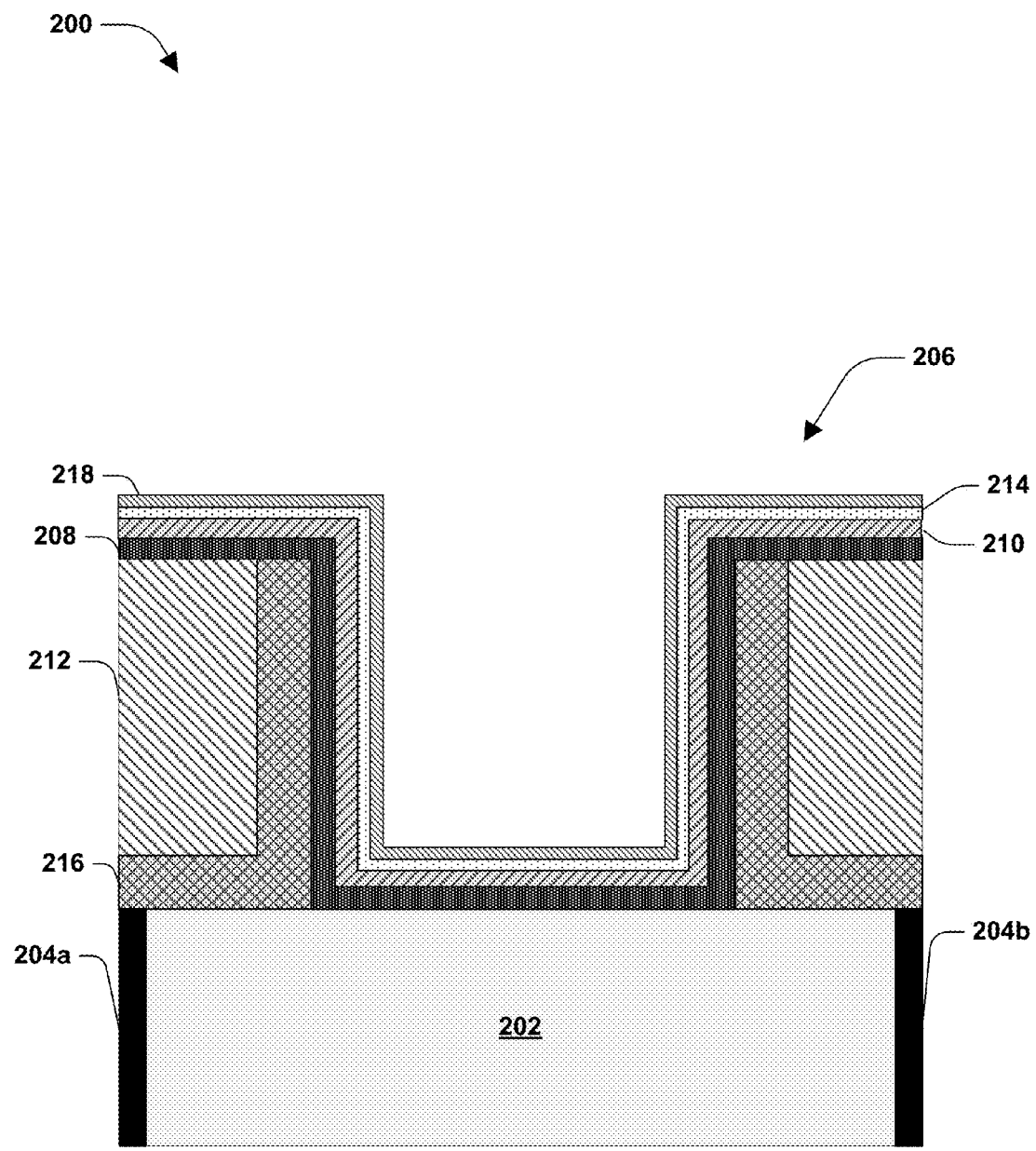
FIG. 3 is a cross-sectional view of a semiconductor device during fabrication, according to some embodiments.

At 104, a gate body 206 is formed, as illustrated in FIG. 3. In some embodiments, the gate body 206 includes at least one of an interfacial layer 208, a gate dielectric layer 210, an interlayer dielectric (ILD) 212, a work function metal layer 214, sidewall spacers 216 or a capping layer 218.

In some embodiments, the interfacial layer 208 is formed on the side wall spacers 216 as well as over the substrate 202. In some embodiments, the interfacial layer 208 includes a silicon oxide ($SiO_x$) layer having a thickness ranging from about 5 to about 50 angstroms. In some embodiments, the interfacial layer 208 includes at least one of HfSiO or SiON formed by at least one of atomic layer deposition (ALD), chemical vapor deposition (CVD), physical vapor deposition (PVD), thermal oxidation and nitridation, plasma oxidation or nitridation.

In some embodiments, the gate dielectric layer 210 is formed over the interfacial layer 208. In another embodiment, the interfacial layer 208 is not present and the gate dielectric layer 210 is formed on the side wall spacers 216 and over the substrate 202. In some embodiments, the gate dielectric layer 210 is a high-k dielectric layer. In some embodiments, the gate dielectric layer 210 is formed by at least one of ALD, CVD, metalorganic CVD (MOCVD), PVD, plasma enhanced CVD (PECVD), plasma enhance ALD (PEALD) or other suitable techniques. In some embodiments, the gate dielectric layer 210 is about 5 angstroms to about 50 angstroms thick. In some embodiments, the gate dielectric layer 210 includes a binary or ternary high-k film. In some embodiments, the gate dielectric layer 210 includes at least one of LaO, AlO, ZrO, TiO, $Ta_2O_5$, $Y_2O_3$, $SrTiO_3$ (STO), $BaTiO_3$ (BTO), BaZrO, HfOx, HfZrO, HfLaO, HfSiO, LaSiO, AlSiO, HfTaO, HfTiO, $(Ba,Sr)TiO_3$ (BST), $Al_2O_3$, $Si_3N_4$ or oxynitrides. In some embodiments, a post high-k deposition anneal is performed as part of forming the dielectric layer 210.

In some embodiments, the ILD 212 includes an oxide formed by at least one of a high aspect ratio process (HARP) or high density plasma (HDP) deposition process. In some embodiments, the deposition of the ILD 212 fills in a gap between the semiconductor device 200 and an adjacent semiconductor device.

In some embodiments, the work-function metal layer 214 is formed over the gate dielectric layer 210. In some embodiments, the work-function metal layer 214 is an N-type or P-type work-function metal. In some embodiments, the work-function metal layer 214 is at least one of titanium aluminide (TiAl), $TiAl_3$, nickel aluminide (NiAl) or iron aluminide (FeAl). In some embodiments, the work-function metal layer 214 is between about 5 angstroms to about 100 angstroms thick. In some embodiments, the work-function metal layer 214 is formed using at least one of an ALD, CVD or PVD process.

In some embodiments, the sidewall spacer 216 includes at least one of silicon nitride, silicon oxide, silicon carbide or silicon oxynitride. In some embodiments, the sidewall spacer 216 is about 3 nm to about 100 nm wide.

In some embodiments, a capping layer 218 is formed over at least one of the gate dielectric layer 210 or the work metal function layer 214. In some embodiments, the capping layer 218 includes titanium nitride (TiN), tantalum nitride (TaN) or $Si_3N_4$. In some embodiments, the capping layer 218 is about 5 angstroms to about 50 angstroms thick. In some embodiments, the capping layer 218 functions as a barrier to protect the gate dielectric layer 210. In some embodiments, the capping layer 218 is formed using at least one of an ALD, CVD or PVD process.

Figure 4:
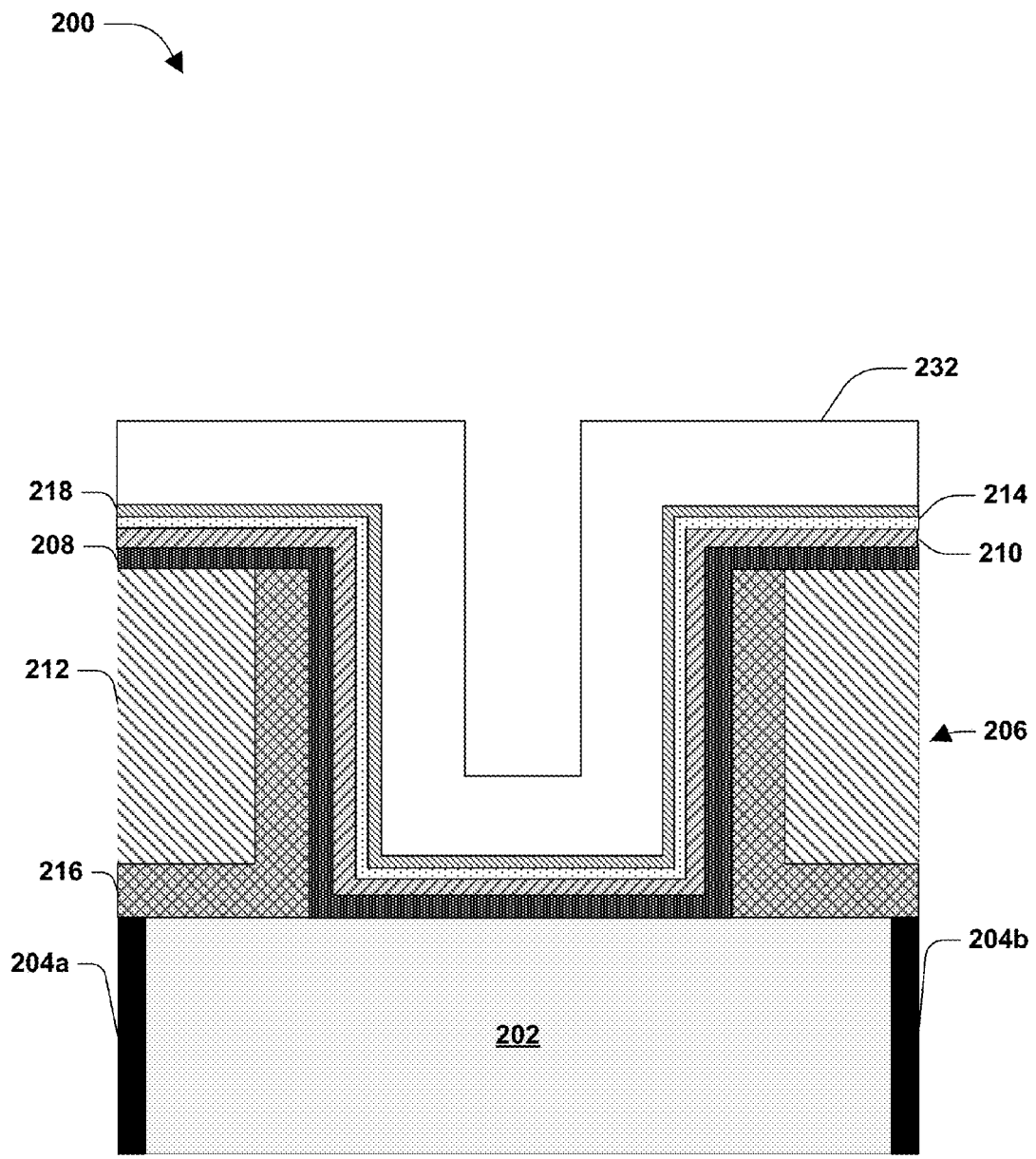
FIG. 4 is a cross-sectional view of a semiconductor device during fabrication, according to some embodiments.

At 106, a conductive prelayer 232 is formed, as illustrated in FIG. 4. In some embodiments, the conductive prelayer 232 is formed over the gate body 206. In some embodiments, the conductive prelayer 232 includes a metal. In some embodiments, the conductive prelayer 232 includes at least one of aluminum (Al), copper (Cu), tungsten (W), titanium (Ti), tantalum (Ta), titanium nitride (TiN), titanium aluminide (TiAl), titanium aluminum nitride (TiAlN), tantalum nitride (TaN), nickel silicon (NiSi) or cobalt silicon (CoSi). In some embodiments, the conductive prelayer 232 includes a conductive material with a work function. In some embodiments, the conductive prelayer 232 includes a poly. In some embodiments, the poly is a poly-silicon. In some embodiments, conductive prelayer 232 includes a doped poly-silicon with at least one of uniform or non-uniform doping. In some embodiments, the conductive prelayer 232 has a thickness of about 3 nm to about 200 nm. In some embodiments, the conductive prelayer 232 has a uniform thickness. In some embodiments, the conductive prelayer 232 is formed using at least one of an ALD, CVD, PVD or plating process.

Figure 5A:
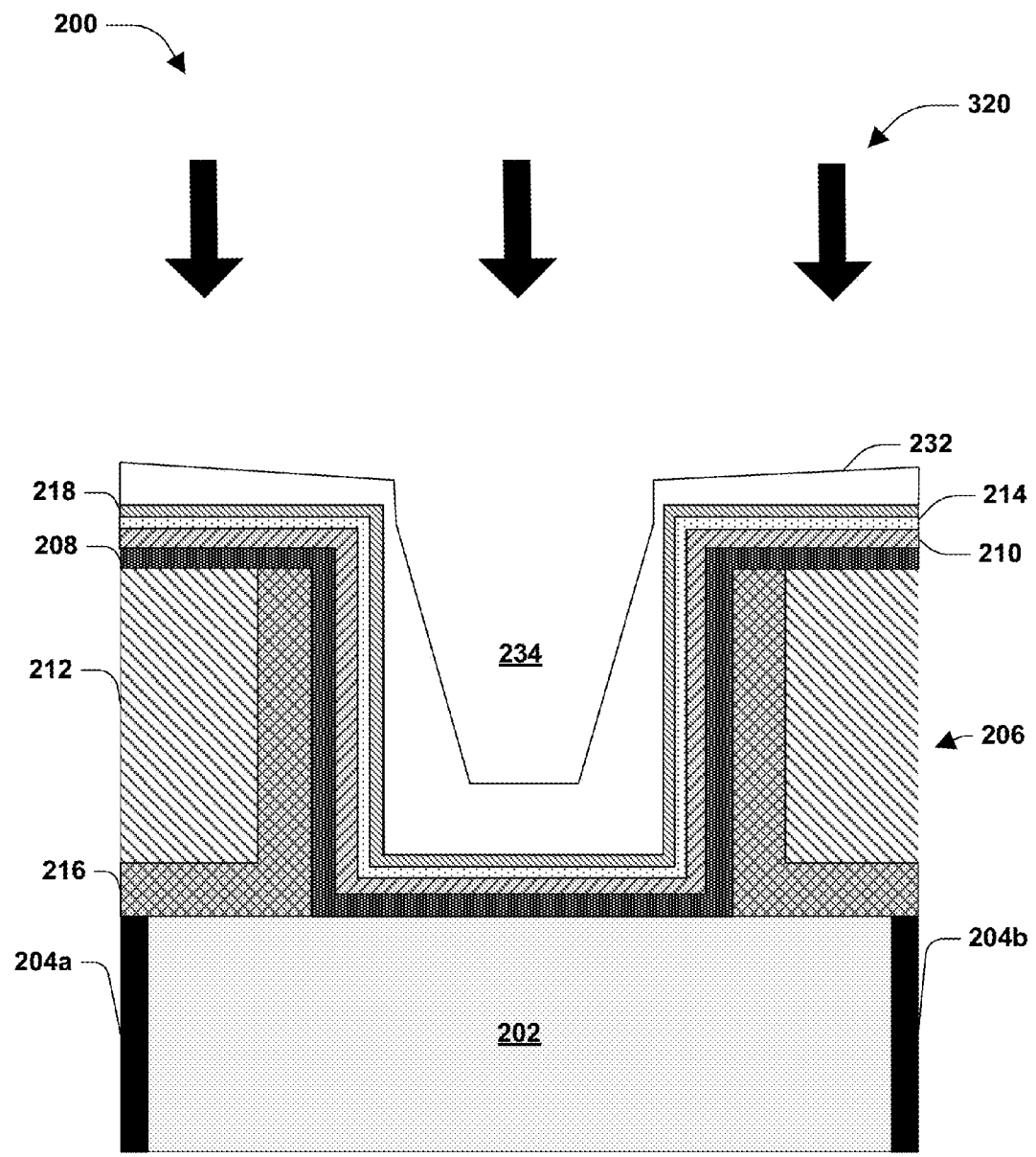
FIG. 5a is a cross-sectional view of a semiconductor device during fabrication, according to some embodiments.
Figure 5B:
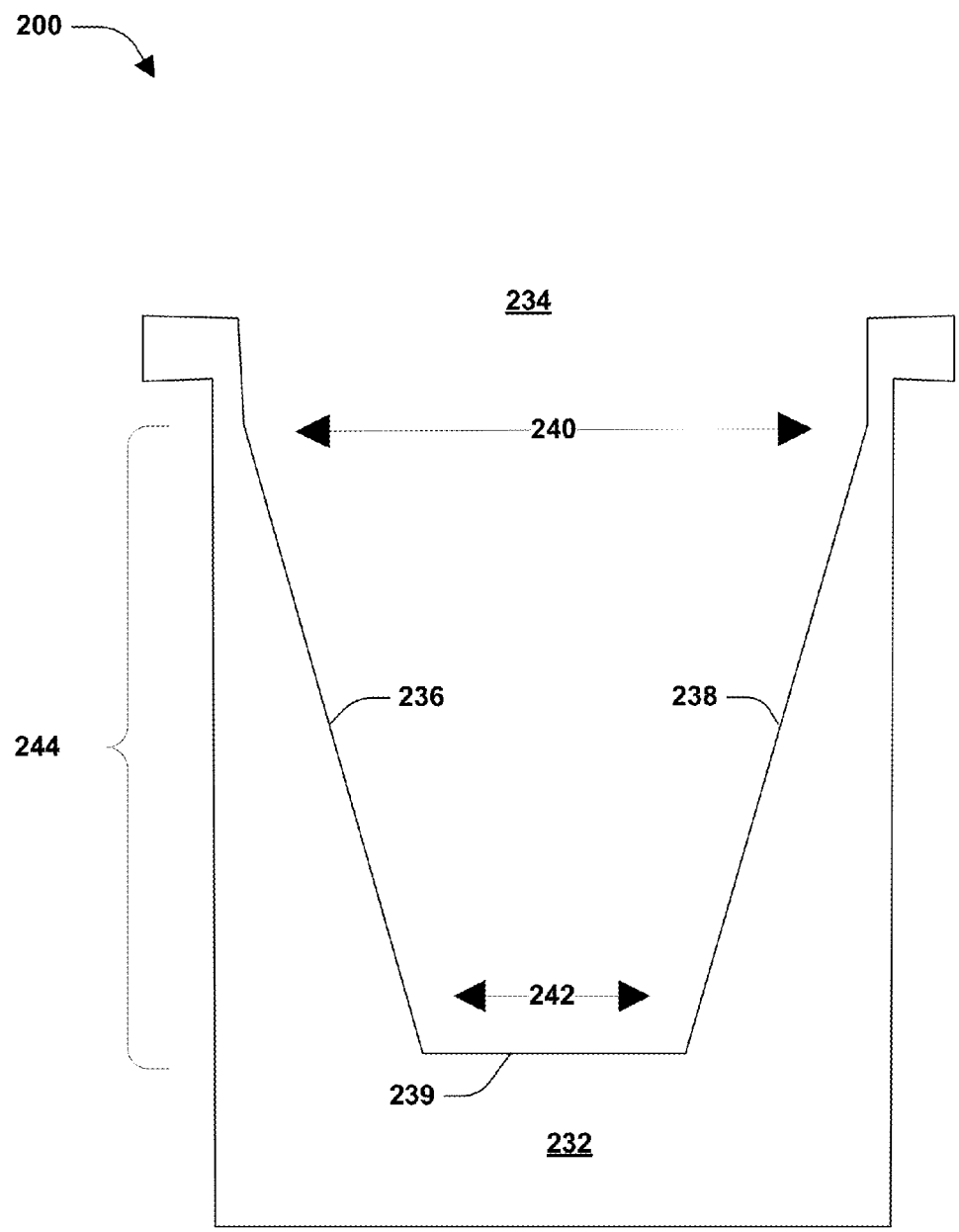
FIG. 5b is a cross-sectional view of a semiconductor device during fabrication, according to some embodiments.

At 108, an opening 234 is formed, as illustrated in FIG. 5a and FIG. 5b. In some embodiments, the opening 234 is formed in the conductive prelayer 232. In some embodiments, the opening 234 is defined by at least one of a first sidewall 236 of the conductive prelayer 232, a second sidewall 238 of the conductive prelayer 232 or a bottom portion 239 of the conductive prelayer 232, as illustrated in FIG. 5b. In some embodiments, the opening 234 includes a top region width 240, a bottom region width 242 or an opening height 244. In some embodiments, the top region width 240 is about 1 nm to about 1000 nm. In some embodiments, the bottom region width 242 is about 2 angstroms to about 1000 nm. In some embodiments, the opening height 244 is about 10 nm to about 1000 nm. In some embodiments, the opening 234 is substantially V-shaped. In some embodiments, the opening 234 has a tapered profile. In some embodiments, the top region width 240 is greater than the bottom region width 242. In some embodiments, the top region width 240 is about 1.3 to about 2.2 times greater than the bottom region width 242.

In some embodiments, the opening 234 is formed by a second process 320, as illustrated in FIG. 5a. In some embodiments, the second process 320 includes an etching process. In some embodiments, the etching process is preformed over a masking element and an exposed surface of the conductive prelayer 232. In some embodiments, the second process 320 includes a dry etching process. In some embodiments, the etching process is a directional etching process. In some embodiments, the directional etching process forms the tapered profile of the opening 234. In some embodiments, the directional etching process is performed such that the top region width 240 is greater than the bottom region width 242. In some embodiments, the etching process includes the use of at least one of hydrogen fluoride (HF), sodium hydroxide (NaOH), chlorine ($Cl_2$), tetrafluoromethan ($CF_4$), sulfur hexafluoride ($SF_6$), or nitrogen trifluoride ($NF_3$). In some embodiments, the etching process includes exposing the conductive prelayer 232 to about 8 mTorr of $SF_6$ to about 250 mTorr of $SF_6$.

Figure 6:
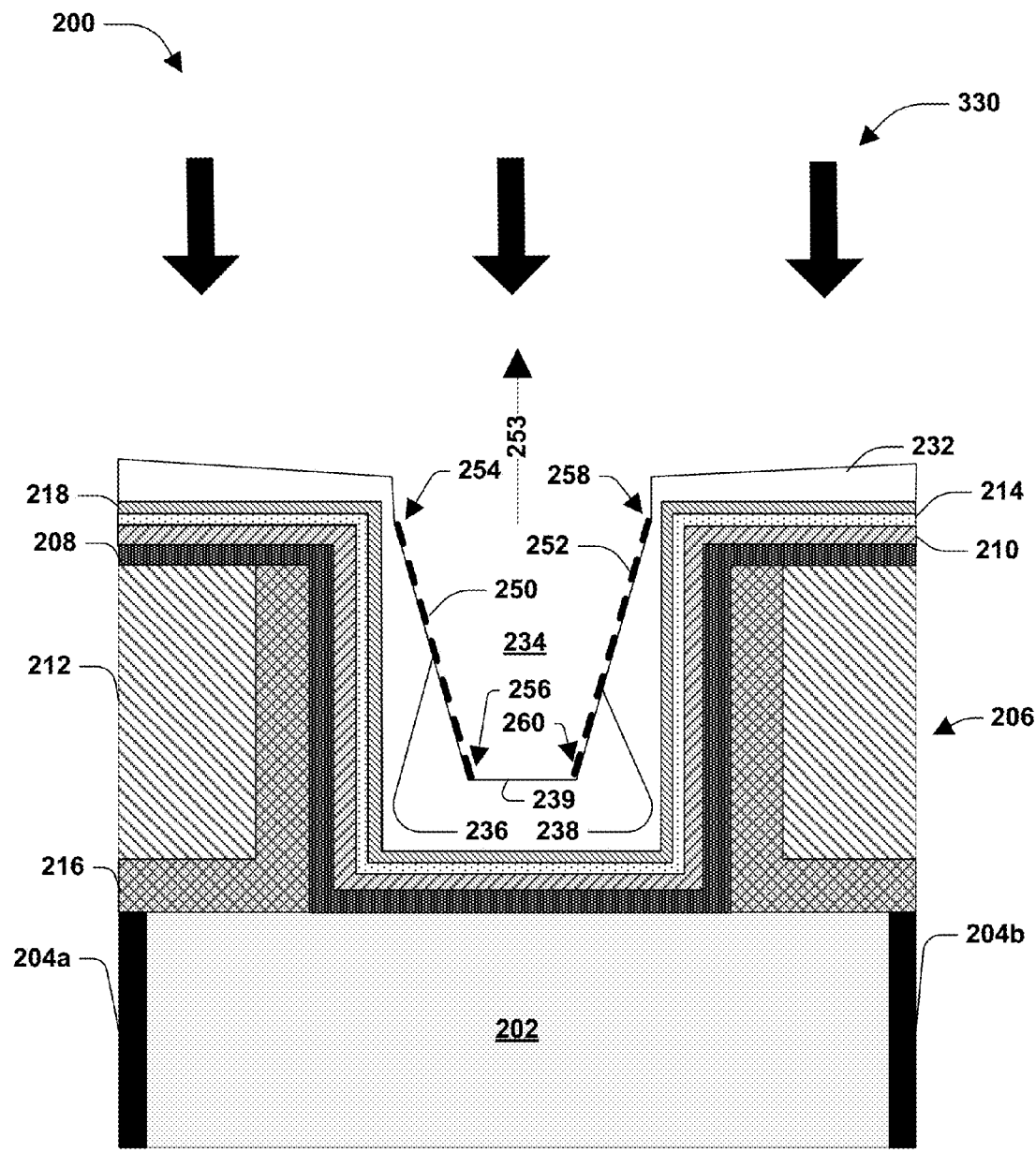
FIG. 6 is a cross-sectional view of a semiconductor device during fabrication, according to some embodiments.

At 110, a first inhibitor film 250 is formed, as illustrated in FIG. 6. In some embodiments, the first inhibitor film 250 is formed over at least one of the first sidewall 236, the second sidewall 238 or the bottom portion 239. In some embodiments, a second inhibitor film 252 is formed over at least one of the first inhibitor film 250, the first sidewall 236, the second sidewall 238 or the bottom portion 239. In some embodiments, the first inhibitor film 250 is formed on the first sidewall 236 and the second inhibitor film 252 is formed on the second sidewall 238. In some embodiments, the first inhibitor film 250 has at least one of a first end 254 or a second end 256 and the second inhibitor film 252 has at least one of a third end 258 or a fourth end 260. In some embodiments, at least one of the first end 254 or the third end 258 is proximate a top portion of the gate body or distal from the substrate and at least one of the second end 256 or the fourth end 260 is proximate a bottom portion of the gate body or proximate the substrate. In some embodiments, the first end 254 and the third end 258 are spaced apart by a top distance and the second end 256 and the fourth end 260 are spaced apart by a bottom distance that is less than the top distance.

In some embodiments, at least one of the first inhibitor film 250 or the second inhibitor film 252 is formed by a third process 330. In some embodiments, the third process 330 includes a passivation process. In some embodiments, the passivation process includes exposing at least one of the first sidewall 236, the second sidewall 238 or the bottom portion 239 to a passivation gas. In some embodiments, passivation gas includes at least one of $N_2$, $O_2$ or $CHF_3$. In some embodiments, the passivation gas includes at least one of about 15 sccm to about 500 sccm of $N_2$, about 5 sccm to about 150 sccm of $CHF_3$ or about 5 sccm to about 150 sccm of $O_2$. In some embodiments, the passivation process is conducted with a power source of about 100 W to 1500 W. In some embodiments, the passivation process is conducted with a bias power of about 0 W to about 450 W. In some embodiments, the passivation process is conducted at a temperature of about 30° C. to about 80° C. In some embodiments, at least some of the etching process and the passivation process are performed concurrently. In some embodiments, a mixture gas includes the passivation gas and the etching gas. In some embodiments, the mixture gas is used when the passivation process and the etching process are carried out at the same time. In some embodiments, the mixture gas includes about 8 sccm to about 250 sccm of $SF_6$, about 15 sccm to about 500 sccm of $N_2$, about 5 sccm to about 150 sccm of $Cl_2$ and about 5 sccm to about 150 sccm of $O_2$.

In some embodiments, the third process 330 includes depositing at least one of the first inhibitor film 250 or the second inhibitor film 252 on at least one of the first sidewall 236, the second sidewall 238 or the bottom portion 239. In some embodiments, at least one of the first inhibitor film 250 or the second inhibitor film 252 is deposited using at least one of an ALD, CVD or PVD process. In some embodiments, at least one of the first inhibitor film 250 or the second inhibitor film 252 includes at least one of a nitride, an oxide, a silicide or a polymer. In some embodiments, at least one of first inhibitor film 250 or the second inhibitor film 252 includes a nonconductive material. In some embodiments, at least one of the first inhibitor film 250 or the second inhibitor film 252 includes at least one of $WN_x$, $WO_x$, $WSi_x$, or $W(CH)_x$. In some embodiments, at least one of the first inhibitor film 250 or the second inhibitor film 252 is configured to inhibit subsequent metal growth on at least one of the first sidewall 236 or the second sidewall 238. In some embodiments, at least one of the first inhibitor film 250 or the second inhibitor film 252 is configured to encourage any subsequent conductive material growth in the opening 234 to occur in a bottom-to-top direction, as illustrated by arrow 253. In some embodiments, at least one of the first inhibitor film 250 or the second inhibitor film 252 is about 1 angstrom to about 200 angstroms thick.

Figure 7:
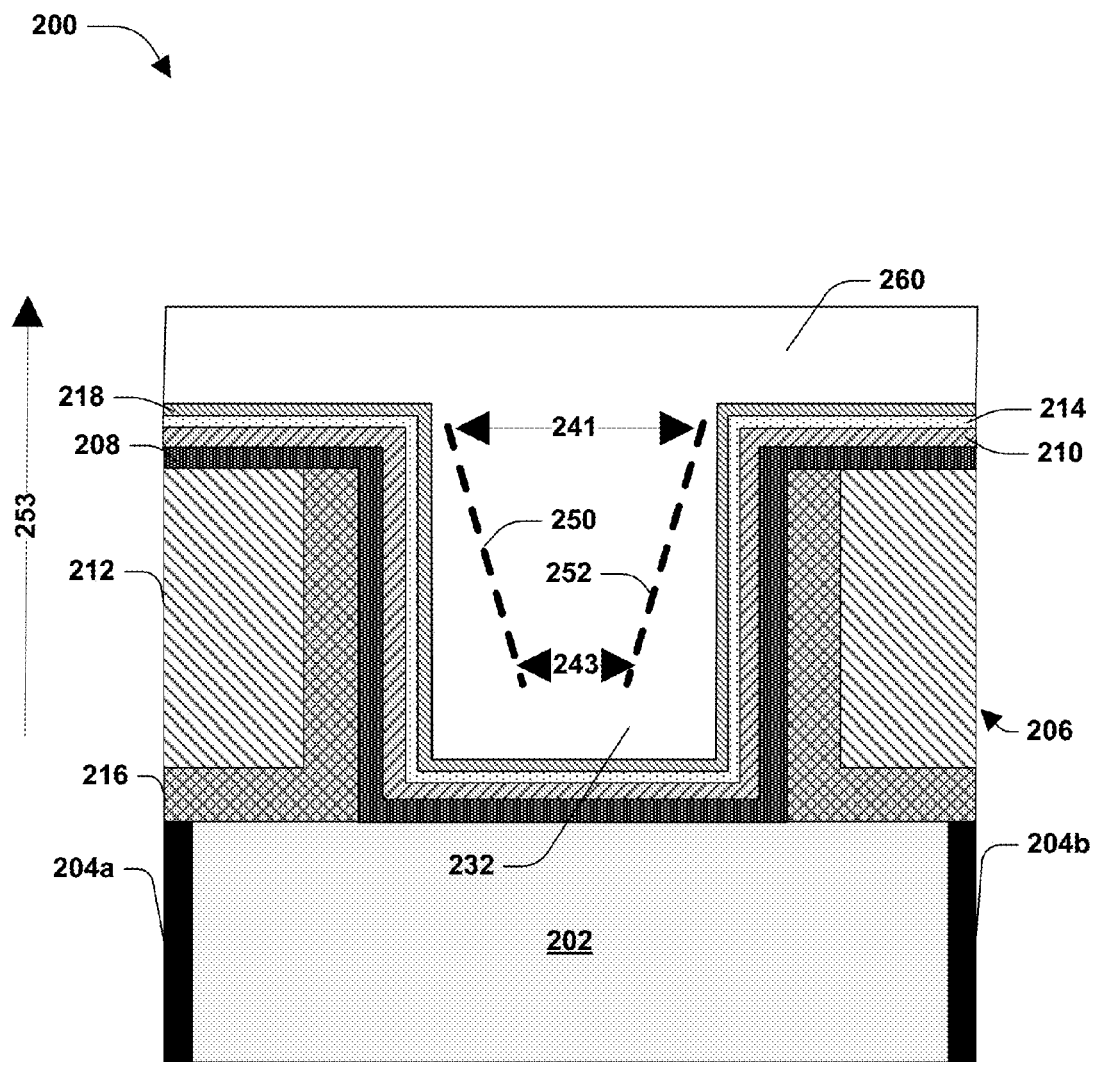
FIG. 7 is a cross-sectional view of a semiconductor device during fabrication, according to some embodiments.

At 112, a conductive layer 260 is formed, as illustrated in FIG. 7. In some embodiments, the conductive layer 260 is formed over at least one of the first inhibitor film 250, the second inhibitor film 252 or the conductive prelayer 232. In some embodiments, the conductive layer 260 includes a metal. In some embodiments, the conductive layer 260 includes at least one of aluminum (Al), copper (Cu), tungsten (W), titanium (Ti), tantalum (Ta), titanium nitride (TiN), titanium aluminide (TiAl), titanium aluminum nitride (TiAlN), tantalum nitride (TaN), nickel silicon (NiSi) or cobalt silicon (CoSi). In some embodiments, the conductive layer 260 includes a conductive material with a work function. In some embodiments, the conductive layer 260 includes a poly. In some embodiments, the poly is a poly-silicon. In some embodiments, conductive layer 260 includes a doped poly-silicon with at least one of uniform or non-uniform doping. In some embodiments, the conductive prelayer 232 and the conductive layer 260 include the same conductive material. In some embodiments, the conductive layer 260 is formed using at least one of an ALD, CVD, PVD or plating process. In some embodiments, the conductive layer 260 is formed by depositing a conductive material in the opening 234 proximate the bottom portion 239 and filling the opening therefrom in the direction represented by the arrow 253. In some embodiments, the tapered shape of the opening 234 inhibits the formations of seams or voids in the conductive prelayer 232 and the conductive layer 260. In some embodiments, the tapered shape of the opening 234 facilitates evenly and consistently depositing at least one of the conductive prelayer 232 or the conductive layer 260. In some embodiments, the conductive layer 260 has a top portion width 241 and a bottom portion width 243, where the top portion width 241 is greater than the bottom portion width 243. In some embodiments, the top portion width 241 of the conductive layer 260 reflects the top region width 240 of the opening 234 and the bottom portion width 243 of the conductive layer 260 reflects the bottom region width 242 of the opening 234.

In some embodiments, the semiconductor device 200 includes other layers or features not specifically illustrated including at least one of a source, a drain, a contact, an interconnect or other suitable features. In some embodiments, other back end of line (BEOL) processes are preformed on the semiconductor device 200.

According to some aspects of the instant disclosure, a semiconductor device is provided. The semiconductor device comprising a gate body, a conductive prelayer over the gate body, a conductive layer over the conductive prelayer and a first inhibitor film between at least part of the conductive prelayer and the conductive layer. In some embodiments, the first inhibitor film has a first end proximate the gate body top portion and a second end proximate the gate body bottom portion. In some embodiments, the first end is a first distance from the first gate body sidewall and the second end is a second distance from the first gate body sidewall. In some embodiments, the second distance is greater than the first distance. The gate body comprising a first gate body sidewall, a second gate body sidewall, a gate body top portion and a gate body bottom portion.

According to some aspects of the instant disclosure, a method of forming a semiconductor device is provided. The method comprising forming a conductive prelayer over a gate body, forming an opening in the conductive prelayer, the opening defined by a first sidewall of the conductive prelayer, a second sidewall of the conductive prelayer and a bottom portion of the conductive prelayer, forming a first inhibitor film on at least one of the first sidewall, the second sidewall or the bottom portion, and forming a conductive layer over the first inhibitor film. In some embodiments, the opening has a top region width and a bottom region width, wherein the top region width is greater than the bottom region width.

According to some aspects of the instant disclosure, a method of forming a semiconductor device is provided. The method comprising forming a gate body over a substrate, a conductive prelayer over the gate body, a first inhibitor film over the conductive prelayer and a conductive layer over the first inhibitor film. In some embodiments, the conductive layer has a top portion width and a bottom portion width, the top portion width greater than the bottom portion width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

It will be appreciated that layers, features, elements, etc. depicted herein are illustrated with particular dimensions relative to one another, such as structural dimensions or orientations, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor device, comprising:
   forming a conductive prelayer over a gate body;
   etching the conductive prelayer to form an opening in the conductive prelayer, wherein:
      the opening is defined by a first sidewall of the conductive prelayer, a second sidewall of the conductive prelayer and a bottom portion of the conductive prelayer extending continuously from the first sidewall of the conductive prelayer to the second sidewall of the conductive prelayer,
      the opening has a top region width and a bottom region width, and
      the top region width is greater than the bottom region width;
   forming a first inhibitor film on at least the first sidewall concurrently with etching the conductive prelayer to form the opening, wherein the first inhibitor film extends along the first sidewall to the bottom portion of the conductive prelayer; and
   forming a conductive layer over the first inhibitor film.

2. The method of claim 1, wherein the conductive prelayer is about 10 angstroms to about 100 angstroms thick.

3. The method of claim 1, wherein forming the first inhibitor film comprises:
   exposing at least one of the first sidewall, the second sidewall or the bottom portion to a passivation gas.

4. The method of claim 3, wherein the passivation gas comprises at least one of $N_2$, $O_2$ or $CHF_3$.

5. The method of claim 1, wherein etching the conductive prelayer comprises:
   performing a dry etching process.

6. The method of claim 1, wherein etching the conductive prelayer comprises:
   exposing the conductive prelayer to at least one of $SF_6$, $NF_3$, $Cl_2$, $CF_4$, HF or NaOH.

7. The method of claim 1, wherein etching the conductive prelayer comprises:

performing a directional etching process such that the top region width is greater than the bottom region width.

8. The method of claim 1, wherein forming the conductive prelayer comprises:
performing at least one of an ALD process or a CVD process.

9. A method for forming a semiconductor device, comprising:
forming a conductive prelayer over a gate body;
etching the conductive prelayer to define an opening, wherein:
the opening is defined by a first sidewall of the conductive prelayer, a second sidewall of the conductive prelayer and a bottom portion of the conductive prelayer extending continuously from the first sidewall to the second sidewall,
the opening has a top region width and a bottom region width, and
the top region width is greater than the bottom region width;
forming a first inhibitor film on the first sidewall and a second inhibitor film on the second sidewall concurrently with etching the conductive prelayer to define the opening, wherein the first inhibitor film extends along the first sidewall to the bottom portion of the conductive prelayer and the second inhibitor film extends along the second sidewall to the bottom portion of the conductive prelayer; and
forming a conductive layer over at least one of the first inhibitor film or the second inhibitor film, the conductive layer in contact with the bottom portion of the conductive prelayer.

10. The method of claim 9, wherein the conductive prelayer is about 10 angstroms to about 100 angstroms thick.

11. The method of claim 9, wherein forming the first inhibitor film and the second inhibitor film comprises:
exposing the first sidewall and the second sidewall to a passivation gas.

12. The method of claim 11, wherein the passivation gas comprises at least one of $N_2$, $O_2$ or $CHF_3$.

13. The method of claim 9, wherein the first inhibitor film comprises tungsten.

14. The method of claim 9, wherein the etching comprises:
performing a dry etching process.

15. The method of claim 9, wherein the etching comprises:
exposing the conductive prelayer to at least one of $SF_6$, $NF_3$, $Cl_2$, $CF_4$, HF or NaOH.

16. The method of claim 9, wherein the etching comprises:
performing a directional etching process such that the top region width is greater than the bottom region width.

17. A method for forming a semiconductor device, comprising:
forming a conductive prelayer over a gate dielectric;
etching a first sidewall of the conductive prelayer to taper the first sidewall and etching a second sidewall of the conductive prelayer to taper the second sidewall, wherein the tapered first sidewall and the tapered second sidewall define an opening having a tapered profile;
forming an inhibitor film on a sidewall of the conductive prelayer defining the opening concurrently with etching the conductive prelayer, wherein the inhibitor film extends to a surface of the conductive prelayer that defines a bottom of the opening; and
forming a conductive layer over the inhibitor film and over the conductive prelayer.

18. The method of claim 17, wherein the inhibitor film is a non-conductive film.

19. The method of claim 17, wherein the conductive prelayer and the conductive layer have a same material composition.

20. The method of claim 17, wherein the conductive layer contacts the conductive prelayer.

* * * * *